United States Patent
Perez et al.

(10) Patent No.: US 6,818,902 B2
(45) Date of Patent: Nov. 16, 2004

(54) POSITRON SOURCE

(75) Inventors: Patrice Perez, Bures-sur-Yvette (FR); André Rosowsky, Paris (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/725,400

(22) Filed: Dec. 3, 2003

(65) Prior Publication Data

US 2004/0178353 A1 Sep. 16, 2004

Related U.S. Application Data

(60) Provisional application No. 60/470,883, filed on May 16, 2003.

(30) Foreign Application Priority Data

Mar. 10, 2003 (FR) .............................. 03 02953
May 15, 2003 (FR) .............................. 03 50154

(51) Int. Cl.$^7$ ............................ H01J 37/26; G21K 7/00
(52) U.S. Cl. ................... 250/427; 250/306; 250/307; 250/308; 250/309; 250/310
(58) Field of Search ................... 250/427, 306–310, 250/156, 190; 376/156, 190

(56) References Cited

U.S. PATENT DOCUMENTS

| | | | | |
|---|---|---|---|---|
| 4,864,131 A | * | 9/1989 | Rich et al. | 250/308 |
| 5,063,293 A | * | 11/1991 | Rich et al. | 250/308 |
| 5,107,221 A | * | 4/1992 | N'Guyen et al. | 315/500 |
| 5,159,195 A | * | 10/1992 | Van House | 250/309 |
| 6,630,666 B2 | * | 10/2003 | Greaves | 250/308 |
| 6,635,871 B2 | * | 10/2003 | Xu et al. | 250/306 |
| 2002/0030160 A1 | * | 3/2002 | Greaves | 250/308 |

OTHER PUBLICATIONS

"The LLNL Electron–Positron Beam Facility", http://www-pat.llnl.gov/H–Div/Positrons/PositronFacility.html.*
van Veen et al., Appl. Surf. Dci. 116 (1997) 39–44.*
Weng et al., Appl. Surf. Sci. 194 (2002) 24–28.*
Baier et al., Phys. Rev. ST Accel. Beans 5, 121001 (2002).*
F,–J. Decker, IEEE, pp. 2002–2004, XP–002260475, "Channeling Crystals for Positron Production", May 5, 1991.
M. Inoue, et al., Nuclear Instruments and Methods in Physics Research, Section—B, Beam Interactions with Materials and Atoms, vol. 173, No. 1–2, pp. 104–111, XP–004223560, "Experiment of Positron Generation Using a Crystal Target at the KEK Electron/Positron Linac", Jan. 2001.
L. V. Jørgensen, et al., Materials Science Form, vol. 363–365, pp. 634–636, XP–008023205, "A Positron Accumulator for Antihydrogen Synthesis", 2001.
R. G. Greaves, et al., Nuclear Instruments and Methods in Physics Research, Section—B, Beam Interactions with Materials and Atoms, vol. 192, No. 1–2, pp. 90–96, XP–004361776, "Positron Trapping and the Creation of High–Quality Trap–Based Positron Beams" May 2002.

* cited by examiner

*Primary Examiner*—John R. Lee
*Assistant Examiner*—Bernard E. Souw
(74) *Attorney, Agent, or Firm*—Oblon, Spivak, McClelland, Maier & Neustadt, P.C.

(57) ABSTRACT

A positron source is applicable particularly to solid state physics, including a thin target receiving a continuous or practically continuous 10 MeV electron beam in grazing incidence and generating positrons upon interaction with this beam.

7 Claims, 3 Drawing Sheets

POSITRON SOURCE

This application claims the benefit of Provisional Application No. 60/470,883, filed May 16, 2003.

TECHNICAL FIELD

This invention relates to a positron source.

It has a very large number of applications, particularly in solid state physics, in material sciences and in surface physics, in which a high counting rate is important for many applications, for example such as a scanning positron microscope, lifetime measurements as a function of the implantation depth or Doppler broadening, and PAES (Positron annihilation induced Auger Electron Spectroscopy).

Other applications of the invention use positronium "atoms" directly (positronium being the bound state of an electron and a positron). However, the production of positronium also requires a large number of positrons.

The invention is also applicable in molecular chemistry and more particularly to the determination of processes involved in superconducting materials with high critical temperature.

It is equally applicable to determination of the aging capacity of paints and coatings.

Furthermore, the invention is also applicable to the detection of defects in a material, as it is known that annihilation of positrons is sensitive to the electron density. For example, small variations of this density are detected when the material thermally expands. Vacancies, in other words single atoms missing from the lattice of a crystalline material, are then very easily detected due to their low electron density. Concentrations of vacant atomic sites of the order of $10^{-6}$ (1 ppm) are observable.

Since a material is analyzed by a contact free positron beam, the material can be heated to a very high temperature. Vacant sites may also be introduced at any temperature by mechanical deformation, sputtering or ion implantation.

The adjustable energy of the positron beam is a means of obtaining in-depth information with a resolution of 10% for structures in thin layers or samples comprising a non-uniform distribution of defects.

Furthermore, electric fields in oxides of microelectronic devices such as MOSs can be used to deviate positrons at the study interface.

Vacancy clusters forming cavities of the order of 0.5 nm can easily be observed by variations of Doppler broadening and the lifetime of positrons.

Observing the formation of positronium demonstrates the presence of broader cavities and can determine their size (up to 20 nm).

For even larger cavities, ortho-positronium (state of the positronium in which electron and positron spins are anti-parallel) survives long enough for it to disintegrate into three photons. In this case, the angular correlation of photons gives an increase on Doppler broadening by a factor of 5.

Note also other applications of the invention:

PRS (Positron Re-emission Spectroscopy),

PAES (Positron annihilation induced Auger Electron Spectroscopy),

REPELS (Re-Emitted Positron Energy Loss Spectroscopy),

LEPD (Low-Energy Positron Diffraction),

PIIDS (Positron Induced Ion Desorption Spectroscopy),

PALS (Positron Annihilation Lifetime Spectroscopy), this technique being extremely important in microelectronics, VEPLS (Variable Energy Positron Lifetime Spectroscopy), and PAS (Positron Annihilation Spectroscopy).

This invention relates more particularly to production of a low energy positron beam, less than 10 MeV, with an instantaneous intensity of more than $10^{10}$ positrons per second, and preferably more than $10^{12}$ positrons per second, for example in order to obtain:

a low energy positron beam, with an energy of less than 10 kev by coupling with an appropriate trap, or positronium atoms, by interaction with an appropriate target.

STATE OF PRIOR ART

Production with a high rate (more than $10^{10}$ per second), of low energy positrons and positronium "atoms" is necessary for industrial applications such as measuring defects in crystals or organic materials, when for example PAS (Positron Annihilation Spectroscopy) or other methods mentioned above are used.

These applications use mainly $^{22}$Na sources as positron beam sources. These compact sources are very suitable for laboratory research. But their maximum activity is about $4 \times 10^9$ Bq and their average lifetime is only 2.6 years.

Moreover, there are some accelerators for which part of the activity, frequently minor, relates to production of positron beams. However, these are mainly large and expensive installations since the energy of electrons used is very frequently several tens of MeV, typically 100 MeV. Positrons emitted may have energies of several tens of MeV.

Moreover, positrons useful for industrial applications have a kinetic energy less than at least one thousand times the energy of the production threshold. Conventionally, metallic moderators with very low efficiency (less than 0.001) are used to slow them.

Furthermore, it is known how to trap a positron beam in a device called a Penning-Malmberg trap. An improved trap, called the Greaves-Surko trap, enormously increases the brightness of the beam by dividing the energy dispersion of this beam by a thousand, with an efficiency of the order of 1.

Greaves-Surko traps are commercially available from the First Point Scientific Company. They comprise a solid neon moderator whose efficiency is close to 1%.

These traps are very advantageous for the above-mentioned applications and since their appearance they have become more widely used, but the energy of the positrons must be less than 1 MeV.

Furthermore, four techniques are known for producing positrons. These techniques use radioactive sources (of $^{22}$Na type) or neutron fluxes from nuclear reactors or tandem accelerators (designed to accelerate ions) or electron accelerators.

We will now examine the disadvantages of these techniques.

The positron current output by a radioactive source is limited by the thickness of the material surrounding the source. Furthermore, the intensity of the positron beam emitted by such a source is of the order of $10^8$ e$^+$/s and therefore of the order of $10^6$ e$^+$/s after moderation.

The use of neutron fluxes output from a nuclear reactor provides a means of obtaining short lifetime radioactive sources capable of producing low energy positrons. However, this technique cannot be industrialized because it requires a nuclear reactor.

One variant of the previous technique consists of using a tandem accelerator to accelerate ions that are sent to a target. This target becomes radioactive and emits low energy positrons. Although a tandem accelerator is smaller than a conventional particle accelerator, it forms a large and expensive installation that requires protection against activation and a maintenance infrastructure.

Large linear accelerators, more simply called "linacs", are also used to produce positrons, by accelerating electrons and sending them to a tungsten or tantalum target. However, these large linacs are very large and expensive installations and there are not enough of them to facilitate the development of positron applications of the type mentioned above.

Let us reconsider known interaction chambers containing a target that is capable of generating positrons by interaction with an electron beam.

To produce positrons (denoted $e^+$) from an electron beam (denoted $e^-$), these electrons have to interact with a target material. The electrons then emit X and gamma photons which sometimes disintegrate in pairs ($e^+$ $e^-$).

Since the number of positrons produced depends on the number of electrons that interacted with the target material, a person skilled in the art will decide to use intense beams like those produced by linac type accelerators.

Since the number of $e^+$ produced by an electron beam increases with the thickness of the target passed through, a person skilled in the art would tend to increase this thickness.

But two problems then arise.

Firstly, the X rays deposit energy in the form of heat in the target.

Secondly, the $e^+$ created can be captured in the target and annihilate before exiting from the target. This annihilation may take place according to two reactions, namely direct collision with an electron or the formation of a positronium atom.

A person skilled in the art naturally associates the use of a thick target with the use of high energy accelerators.

Systems that produce high energy $e^+$ (more than 10 MeV) for particle physics experiments are not as sensitive to the second problem because high energy $e^+$ do not annihilate, and particularly do not form positronium. Furthermore, for industrial applications in which $e^+$ must have a very low energy, the formation of positronium along the path between the location at which the $e^+$ is created from the target exit point destroys a large proportion of the $e^+$.

On the other hand, the first problem becomes very penalizing at high energies. For a given amount of heat deposited in the target, a 100 MeV electron beam generator and a 10 MeV electron beam generator provide the same number of "useful" positrons with an energy of less than or equal to 1 MeV.

For example, consider firstly the existing technique for a 100 MeV generator sending electrons to a 1 mm×1 cm² target at 90 degrees, and secondly a 10 MeV generator sending electrons to a 50 μm×1 cm² target at 3 degrees as proposed according to one example of this invention. For the same heat deposited in the target, and a similar number of useful $e^+$ produced, the 100 MeV generator will consume 50 kW and a 10 MeV generator will consume 10 kW. The 40 kw difference is wasted and must be evacuated from the collection system in the form of heat.

In order to use a larger proportion of the positrons produced, the large installations using a high energy linac such as the Lawrence Livermore National Laboratory in California (USA), and the ISA (Institute for Ring Storage Facilities, University of Aarhus (Denmark)), use tungsten deceleration sheets placed behind the target, possibly combined with an appropriate electric field. But this type of device absorbs many positrons, in other words it limits the beam intensity.

PRESENTATION OF THE INVENTION

The purpose of this invention is to overcome the disadvantages mentioned above.

Its purpose is a positron source, this source comprising means of generating an electron beam and a target that comprises a substantially plane surface, this target being designed to receive an electron beam on this substantially plane surface, at a predetermined angle of incidence, counted with respect to the substantially plane surface, and to generate positrons by interaction with this electron beam, this source being characterized in that the generated electron beam is continuous or quasi-continuous and the energy of the electrons is of the order of 10 MeV, and the target thickness is less than 500 μm and the predetermined angle of incidence is less than 10°.

According to one preferred embodiment of the positron source according to the invention, the thickness of the target is within the interval ranging from 10 μm to 100 μm and the predetermined angle of incidence is within the interval ranging from 2° to 5°.

Preferably, the electron beam generation means generate a continuous beam and comprise an electron accelerator comprising a coaxial cavity that electrons pass through several times in a median plane perpendicular to the axis of this cavity.

This electron accelerator is known under the term "Rhodotron" (registered trademark) and is described in the following document:

FR 2616032 A corresponding to U.S. Pat. No. 5,107,221 A.

In one preferred embodiment, this invention also comprises sorting means between positrons and electrons that did not interact with the target, said sorting means comprising:

first magnetic means, whose axis is close to the beam axis and passes through the plane of the target, and which are designed to generate a magnetic field that can make positrons emitted by the target diverge, these first magnetic means being arranged on the input side of the target at an appropriate distance, a magnetic quadrupole for focusing the positron beam, said magnetic quadrupole having the same axis as the first magnetic means, being placed on the output side of the target, and being designed to make the positron beam section circular, said positron beam being very flat at the output from the area of the interaction between electrons and the target, first stop means, located on the axis of the first magnetic means, on the output side of the quadrupole, at a sufficiently long distance to focus positrons into a beam with a circular section, said first stop means being designed to stop electrons from the electron beam that did not interact with the target, second magnetic means, along the same axis as the first magnetic means, arranged on the output side of the first stop means, at an appropriate distance from the first magnetic means to generate a magnetic field capable of making the positrons converge, the first and second means cooperating to generate a magnetic field capable of preventing these positrons from encountering the first stop means.

The positron source according to the invention may also include trapping means, designed to trap positrons generated by the target.

The trapping means comprise a moderator designed to decelerate positrons and electromagnetic means of concentrating these positrons.

These trapping means may comprise a Greaves-Surko trap, about which one may refer to the following document:

R. Greaves and C. M. Surko, Nucl. Inst. Meth. B192 (2002) 90.

Preferably, the positron source according to the invention also comprises:

second stop means, for example a lead wall cooled by water circulation, designed to stop electrons in the electron beam which did not interact with the target and which reached a zone between the second magnetic means and the trapping means, and to prevent these electrons from reaching the trapping means, and, means of guiding positrons towards the trapping means through these second stop means.

BRIEF DESCRIPTION OF THE DRAWINGS

This invention will be better understood after reading the following description of example embodiments, which are given for guidance only and are in no way limitative, with reference to the attached drawings, in which.

DETAILED DESCRIPTION OF PARTICULAR EMBODIMENTS

Figure 1A:
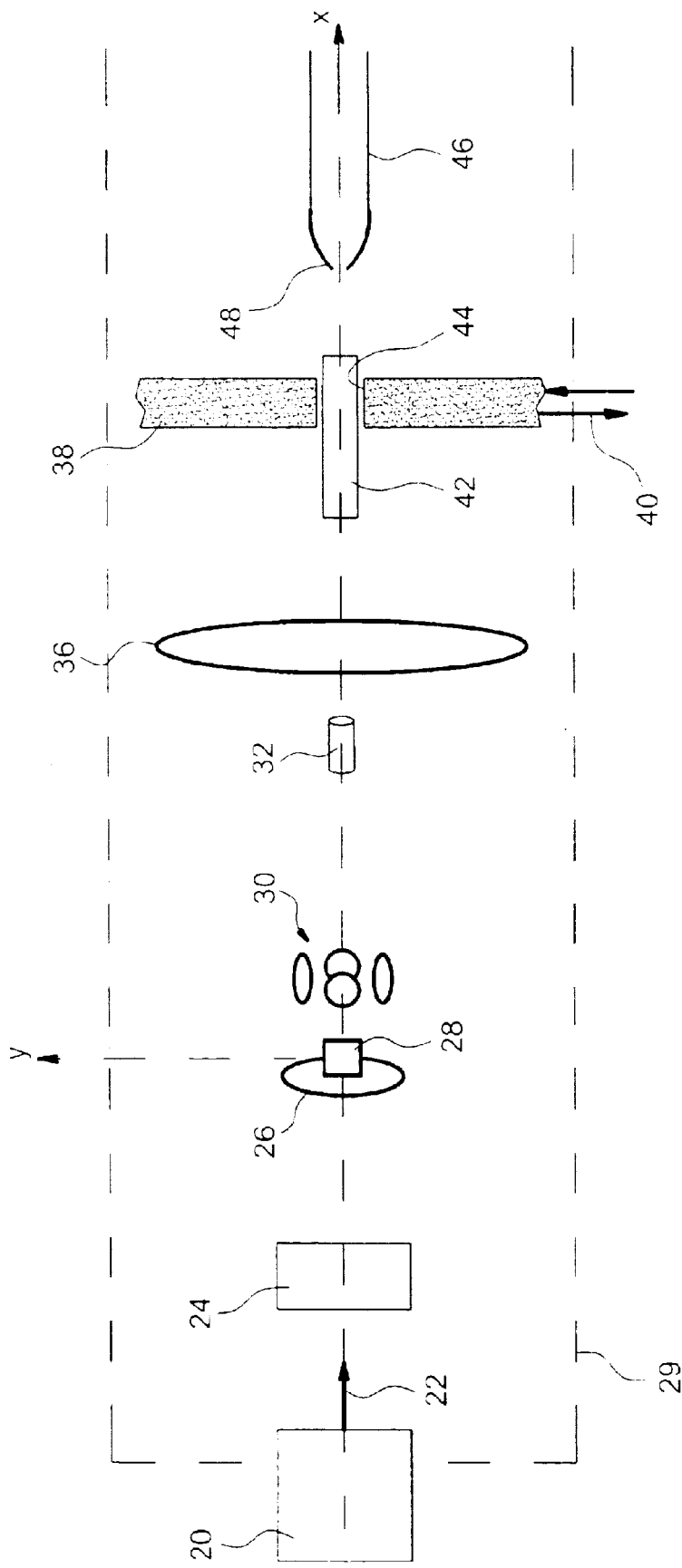
FIGS. 1A and 1B are diagrammatic views of a particular embodiment of the positron source according to the invention.

The invention is based mainly on the interaction of a thin target, preferably made of tungsten, and an electron beam that will be directed onto this target in grazing incidence.

Preferably, the thickness of the target is within the interval varying from 10 $\mu$m to 100 $\mu$m and for example may be equal to 50 $\mu$m and the angle of the electron beam with the target may be within the interval from 2° to 5° and for example it may be equal to 3°.

This invention is a means of producing positrons with a low energy (less than 1 MeV) starting from low energy electron beams (10 MeV) emitted by an electron source operating in continuous mode. Due to this characteristic, the electron source may be a Rhodotron (registered trademark), that is a low volume and low consumption industrial machine (100 kW maximum beam power).

The two problems mentioned above limit the production capacity of low energy positrons in known systems. The invention extends these limits by reducing heat deposited in the target. Finally, the invention enables a more efficient collection of $e^+$ produced.

Diagrammatically, in known systems, $e^-$ are sent at 90° (or at a large angle, for example 45°) from the plane of the target. In the invention, $e^-$ are sent at grazing incidence, typically 3°, from the plane of the target. This particular configuration has several advantages compared with configurations of known systems.

The inventors have observed that for the same number of electrons passing through the target, the temperature rise is 2.5 times lower at 3°, than for an equal equivalent thickness (crossing distance in a straight line) at least the same number of low energy $e^+$ are produced at 3°, and that the number of $e^+$ produced at 3° is about twice as high for the same temperature rise.

Now consider the efficiency at which the produced $e^+$ are collected.

Once the $e^+$ have been produced and extracted from the target, they have to be separated from the electron beam since the electron beam has a very high energy incompatible with equipment that collects $e^+$.

Furthermore, $e^+$ need to be concentrated spatially in order to use them. These two constraints on the use of $e^+$ are achieved at the expense of a large loss of $e^+$ in known systems.

Once again, the use of a beam with grazing incidence (for example 3°) on a thin target, for example 50 $\mu$m thick (equivalent thickness equal to 1 millimeter), can give good collection efficiency of $e^+$ by separating them from $e^-$.

In grazing incidence, the $e^-$ can be spread over a large area of the target, without the $e^+$ produced being collected on a large area. We will call the area from which the $e^+$ originate as seen from the collection system the "frontal surface".

Then at 3°, the frontal interaction area of $e^-$ on the target is 1×20 mm² for a target area of 20×20 mm². This frontal area would be 20 times greater at an incidence of 90°. Therefore, the collection system should cover an area 20 times greater.

In the grazing incidence configuration, the statistical correlation between the angle of emission of a positron and the energy of the positron is maintained.

In particular, since the low energy $e^+$ that we want to collect are emitted at a high angle compared with the electrons, this angular separation may be used to separate the $e^+$ from the $e^-$ in the beam that passes through the target.

We will now present these two advantages for an example of the positron source according to the invention.

This example is diagrammatically illustrated in FIG. 1A and shows a system for production and extraction of low energy $e^+$ (less than or equal to 1 MeV).

This system comprises the following items in sequence along an x axis:

a Rhodotron (registered trademark) 20, that outputs an electron beam 22 that will produce positrons, this beam propagating along the x' axis (FIGS. 1A and B) at 3° from the x axis, means 24 of shaping and guiding the beam 22, a first magnetic coil 26, with its axis coincident with the x axis, a thin plate 28 made of tungsten, one face of which is provided with the beam 22 at grazing incidence, this plate 28 forming the target for electrons, a quadrupole magnet 30 that focuses positrons emitted by plate 28 onto the x axis, a tungsten cylinder 32 designed to stop electrons that passed through the plate 28, a second magnetic coil 36, with its axis coincident with the x axis, a lead wall 38, designed to absorb residual electrons, and cooled by water circulation 40, a solenoid 42 with its axis coincident with the x axis, and that passes through the wall 38, a drilling 44 being provided for this purpose in the wall, this solenoid possibly being replaced by a set of magnetic coils whose common axis is the x axis, a Greaves-Surko trap 46 preceded by a moderator 48.

A vacuum chamber 29 is provided for propagation of electrons output from the Rhodotron, and positrons, under a vacuum.

Figure 2:
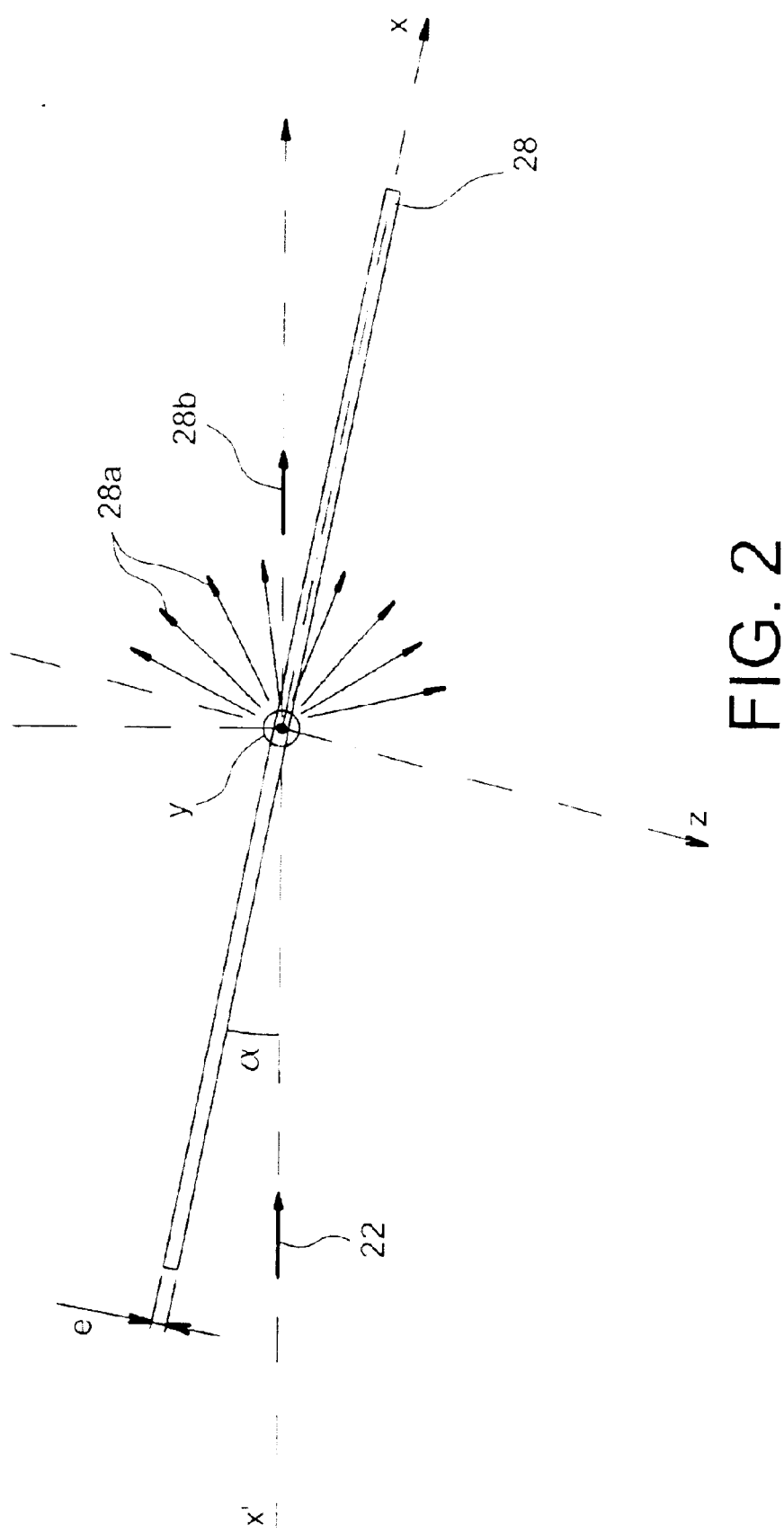
FIG. 2 is a diagrammatic sectional view of the target used in the positron source in FIG. 1.

FIG. 2 specifies the orientation of the target plate 28 for which the thickness is denoted e.

Figure 1B:
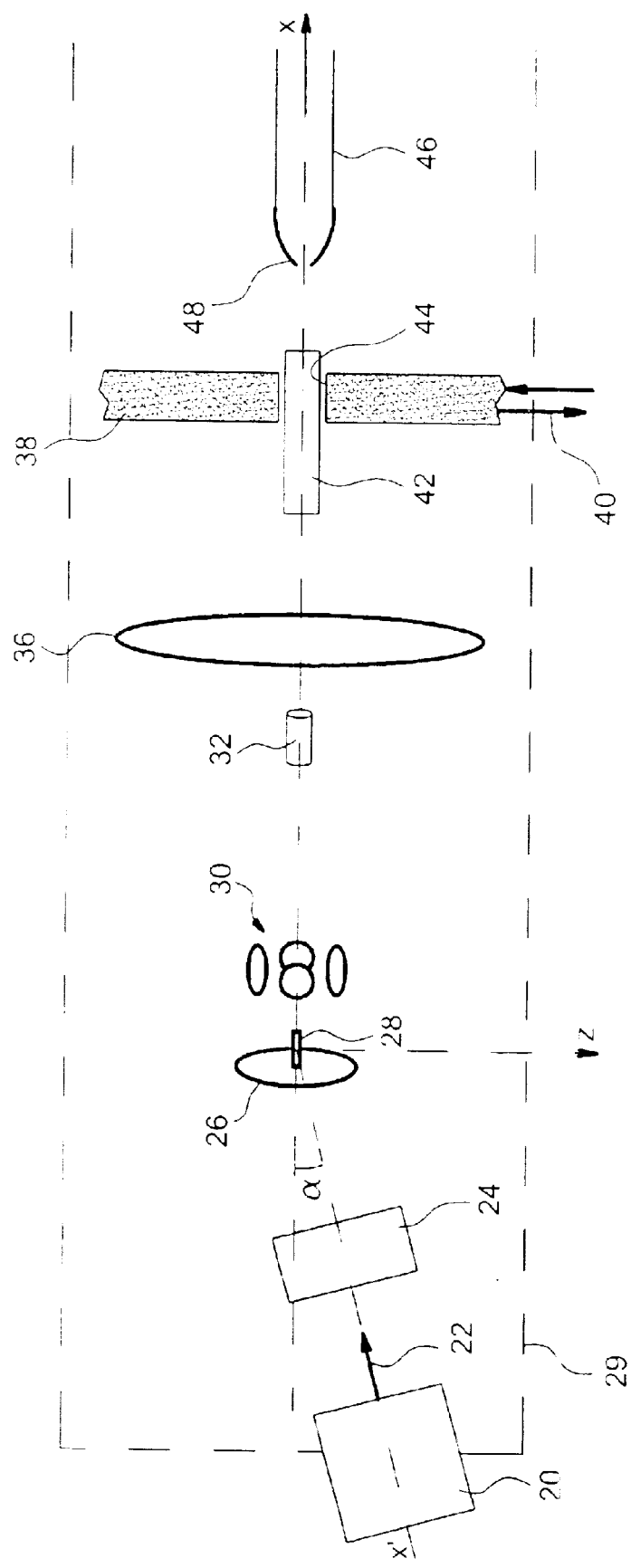

Two other axes y and z are defined, perpendicular to each other and to the x axis, as can be seen in FIGS. 1A and 2. FIG. 1B shows a top view of the example of FIG. 1A (along the y axis).

The plate 28 is in the xy plane. The electron beam propagates at a very small angle alpha, of the order of 3 degrees in the example, from plate 28.

The figure also shows arrows 28a representing positrons emitted by the target and an arrow 28b representing electrons that pass through this target without interacting with it.

The inside diameter of the coil 26 is 20 cm. An 800 kA current passes through it. This coil produces a magnetic field of 5.06 T at its center and may advantageously be superconducting.

The thickness e of the tungsten target is 50 $\mu$m. It is located at about twenty centimeters behind the center of the coil 26 and its area is 3 cm×3 cm, although only a central 2 cm×2 cm part of this area intercepts electrons.

The quadrupole magnet 30 comprises four coils making up the poles of this magnet and with an entry surface at 20 cm from the x axis. These coils have 100 loops and each loop carries a current of 20 A. The magnet 30 is located at a distance of 10 cm from the edge of the target 28.

The inside diameter of the coil 36 is 100 cm. This coil has 1000 loops and each loop carries a current of 20 A. This coil is located at a distance of 90 cm from the center of the target 28.

The diameter of the solenoid 42 is slightly less than 10 cm and its length is 100 cm, and it may be replaced by coils with a diameter slightly less than 10 cm at a spacing of 7 cm from each other. These coils each have 100 loops and each loop carries a current of 20 A.

The objective with a solenoid or coils is to make a tube with a fairly uniform low intensity magnetic field called an "exit tube".

The last 10 cm of this exit tube pass through the lead wall 38 that absorbs the $e^-$ while the collected $e^+$ pass through this wall through the exit tube.

The 10 MeV electron beam 22 output by the Rhodotron is rectangular with a section of 1 mm×20 mm, with its largest dimension (20 mm) being parallel to the plane of the target. The trajectory of the beam is at an angle of 3° from this plane.

The target is placed after the superconducting coil 26 so that $e^+$ emitted by the target are in a divergent field. This configuration enables very low energy $e^+$ (a few tens of keV) to propagate towards positive x ("forwards").

$e^+$ with less than 1 MeV are preferably emitted at an angle of more than 45°, and are captured by field lines of coil 26 and diverge from the x axis. Coil 36, for which the diameter is three times greater than the diameter of the coil 26 and for which the current is 30 times less than the current in this coil 26, produces a slightly convergent field.

This coil 36 is placed 1.10 meters from the coil 26, and it only becomes preponderant at 80 cm from the target such that low energy $e^+$ that are remote from the x axis along the field lines of the coil 26 are now captured by the field lines of the coil 36 and once again converge towards the x axis.

This trajectory, that moves away from and then towards the x axis, enables low energy $e^+$ to avoid the tungsten cylinder 32, this cylinder 32 having a diameter of 2 cm and a length of 5 cm and being located on the x axis at 50 cm from the target.

The energy of electrons that have not produced pairs ($e^+$ $e^-$) is between 9 MeV and 10 MeV, therefore these electrons are not trapped by the field lines of coils 26 and 36. These electrons, for which the trajectory before the target is at 3° from the x axis, remain approximately within a cone with its axis along the x axis and with a half angle of 3° at the vertex.

The coil 26 also makes the electron beam rotate by about 45° around the x axis while remaining approximately within this cone, which must be taken into account in choosing the orientation of the target. Consequently, these electrons separate by about 5 cm per meter of propagation along the x axis.

Due to the rectangular shape of the beam, 10% of these electrons would be mixed with $e^+$ at the exit from the system if they were not stopped. But since the coil 26 does not move them away from the x axis, these electrons are stopped by the tungsten cylinder.

After the coil 36, the $e^+$ are guided towards the output by the magnetic tube field (this field being weak). The distance separating the coil 36 from the exit wall 38 is 1 meter.

The electrons that were not stopped by the tungsten cylinder 32 are outside this cylinder 32 at the exit wall 38, so that they are stopped by this wall which consists of lead shielding cooled by water circulation.

The efficiency of the system in FIG. 1A is illustrated by the following numerical values.

An electron beam with an energy of 10 MeV and an intensity of 5 mA, has a power of 50 kw. Out of these 50 kW:

the target produces about 10 W in the form of pairs (e+ e−), 5 kW are stopped by the tungsten cylinder, 100 W pass through the exit tube at a radius of less than 4 cm, 350 W pass through the exit tube at a distance of between 4 cm and 5 cm from the x axis, the remainder (about 44.5 W) is stopped by the lead wall.

Furthermore, the collection efficiency measured as being the number of e+ at the exit from the exit tube, divided by the number of e+ produced, is about 55% for e+ with less than 1 MeV and about 60% for e+ with less than 600 keV.

This system illustrates the advantage of a thin target (for example 50 $\mu$m thick), used at grazing incidence, since this maintains the correlation between the angle of emission of the $e^+$ and the energy. Separation would not work without this correlation.

Furthermore, with this configuration, it is possible to keep a small section of the beam (1 mm×20 mm) without which the emitted $e^+$ would be too dispersed to be efficiently collected at the exit.

The entire trajectory of positrons is inside a vacuum chamber in which the residual pressure is low, preferably less than 100 Pa. This is because 65% of the $e^+$ would be lost at atmospheric pressure (of the order of $10^5$ Pa), this calculation taking scattering into account. A pressure of the order of $10^2$ Pa reduces losses to less than one per thousand.

What is claimed is:

1. A positron source, said source comprising;

an electron source configured to generate a continuous or quasi-continuous electron beam in which the energy of the electrons is of the order of 10 MeV; and a target comprising a substantially plane surface and having a thickness less than 500 $\mu$m;

said target configured to receive an electron beam on said substantially plane surface at a predetermined angle of incidence of less than 10° measured with respect to the substantially plane surface, and to generate positrons by interaction with said electron beam.

2. A positron source according to claim 1, wherein the thickness of the target is within the interval ranging from 10 µm to 100 µm and the predetermined angle of incidence is within the interval ranging from 2° to 5°.

3. A positron source according to claim 1, wherein;

the electron source comprises an electron accelerator and generates a continuous beam; and said electron accelerator comprises a coaxial cavity that electrons pass though several times in a median plane perpendicular to the axis of said cavity.

4. A positron source according to claim 1, also comprising:

a sorting mechanism configured to sort between positrons and electrons that did not interact with the target, said sorting mechanism comprising:

a first magnetic device having an axis in proximity to the beam axis and passing through the plane of the target, said first magnetic device arranged on the input side of the target at a distance, and configured to generate a magnetic field causing positrons emitted by the target to diverge;

a magnetic quadropole having the same axis as the first magnetic device and placed on the output side of the target, said magnetic quadropole configured to focus the positron beam and make the positron beam circular, said positron beam being flat at the output from the area of interaction between the electrons and the target;

a first stopping mechanism configured to stop electrons from the electron beam that did not interact with the target, said first stopping mechanism located on the same axis as the first magnetic device on the output side of the quadropole and at a distance so as to focus positrons into the circular section of the positron beam; and a second magnetic device having the same axis as the first magnetic device and arranged on the output side of the first stopping mechanism, said second magnetic device arranged at a distance from the first magnetic device and configured to generate a magnetic field capable of causing the positrons to converge, said first and second magnetic devices cooperating to generate a magnetic field which prevents the positrons from encountering the first stopping mechanism.

5. A positron source according to claim 1, also comprising:

a trapping mechanism configured to trap positrons generated by the target; and a guiding mechanism configured to guide the positrons towards the trapping mechanism.

6. A positron source according to claim 5, in which the trapping mechanism includes a Greaves-Surko trap.

7. A positron source according to claim 4, also comprising:

a trapping mechanism configured to trap positions generated by the target;

a guiding mechanism configured to guide said positrons towards said trapping mechanism;

a second stopping mechanism configured to stop electrons in the electron beam which did not interact with the target and reached a zone between the second magnetic device and the trapping mechanism, and to prevent the electrons from reaching the trapping mechanism;

a guiding mechanism configured to guide the positrons towards the trapping mechanism through the second stopping mechanism.

* * * * *